(12) United States Patent
Song et al.

(10) Patent No.: US 7,670,862 B2
(45) Date of Patent: *Mar. 2, 2010

(54) SILICON OPTOELECTRONIC DEVICE, MANUFACTURING METHOD THEREOF, AND IMAGE INPUT AND/OR OUTPUT APPARATUS USING THE SAME

(75) Inventors: In-jae Song, Yongin-si (KR); Byoung-Iyong Choi, Seoul (KR)

(73) Assignee: Samsung Electronics Co., Ltd. (KR)

( * ) Notice: Subject to any disclaimer, the term of this patent is extended or adjusted under 35 U.S.C. 154(b) by 814 days.

This patent is subject to a terminal disclaimer.

(21) Appl. No.: 11/284,107

(22) Filed: Nov. 22, 2005

(65) Prior Publication Data
US 2006/0226445 A1    Oct. 12, 2006

(30) Foreign Application Priority Data
Nov. 24, 2004    (KR)    ............... 10-2004-0097007

(51) Int. Cl.
H01L 21/00    (2006.01)
(52) U.S. Cl. .............. 438/57; 438/70; 438/72; 438/73; 438/96; 438/97; 257/E25.001; 257/E25.029; 257/E25.032
(58) Field of Classification Search .......... 438/57, 438/70, 72, 73, 96, 97; 257/E25.001, E25.029, 257/E25.032
See application file for complete search history.

(56) References Cited

U.S. PATENT DOCUMENTS

| | | |
|---|---|---|
| 3,879,606 A | 4/1975 | Bean |
| 4,013,465 A | 3/1977 | Clapham et al. |
| 4,210,923 A | 7/1980 | North et al. |
| 4,371,847 A | 2/1983 | Biard et al. |
| 4,684,964 A | 8/1987 | Pankove et al. |

(Continued)

FOREIGN PATENT DOCUMENTS

EP    1328024 A2    7/2003

(Continued)

OTHER PUBLICATIONS

U.S. Patent Office Action dated Jan. 29, 2008, in U.S. Appl. No. 11/285,192.

(Continued)

Primary Examiner—M. Wilczewski
Assistant Examiner—Telly D Green
(74) Attorney, Agent, or Firm—Cantor Colburn LLP

(57) ABSTRACT

A method of manufacturing a silicon optoelectronic device, a silicon optoelectronic device manufactured by the method, and an image input and/or output apparatus having the silicon optoelectronic device are provided. The method includes: preparing an n-type or p-type silicon-based substrate; forming a polysilicon in one or more regions of the surface of the substrate; oxidizing the surface of the substrate where the polysilicon is formed, to form a silicon oxidation layer on the substrate, and forming a microdefect flection pattern at the interface between the substrate and the silicon oxidation layer, wherein the microdefect flection pattern is formed by the oxidation accelerated by oxygen traveling through boundaries of the grains in the polysilicon; exposing the microdefect flection pattern by etching the silicon oxidation layer; and forming a doping region by doping the exposed microdefect flection pattern with a dopant of the opposite type to the substrate.

46 Claims, 12 Drawing Sheets

U.S. PATENT DOCUMENTS

| | | | |
|---|---|---|---|
| 5,093,576 | A | 3/1992 | Edmond et al. |
| 5,101,246 | A | 3/1992 | Onodera |
| 5,223,919 | A | 6/1993 | Whight et al. |
| 5,268,317 | A | 12/1993 | Schwalke et al. |
| 5,283,447 | A | 2/1994 | Olbright et al. |
| 5,293,393 | A | 3/1994 | Kosaka |
| 5,324,965 | A | 6/1994 | Tompsett et al. |
| 5,361,273 | A | 11/1994 | Kosaka |
| 5,391,896 | A | 2/1995 | Wanlass |
| 5,514,620 | A | 5/1996 | Aoki et al. |
| 5,565,676 | A | 10/1996 | Tanabe et al. |
| 5,574,744 | A | 11/1996 | Gaw et al. |
| 5,583,351 | A | 12/1996 | Brown et al. |
| 5,607,876 | A * | 3/1997 | Biegelsen et al. ............. 438/45 |
| 5,726,440 | A * | 3/1998 | Kalkhoran et al. ....... 250/214.1 |
| 5,793,060 | A | 8/1998 | Morikawa |
| 5,838,174 | A | 11/1998 | Nakagawa et al. |
| 5,908,307 | A | 6/1999 | Talwar et al. |
| 5,920,078 | A | 7/1999 | Frey |
| 6,147,366 | A | 11/2000 | Drottar et al. |
| 6,278,145 | B1 | 8/2001 | Kato |
| 6,297,115 | B1 | 10/2001 | Yu |
| 6,355,945 | B1 | 3/2002 | Kadota et al. |
| 6,359,323 | B1 | 3/2002 | Eom et al. |
| 6,552,373 | B2 | 4/2003 | Ando et al. |
| 6,566,595 | B2 | 5/2003 | Suzuki |
| 6,664,744 | B2 | 12/2003 | Dietz |
| 6,693,736 | B1 | 2/2004 | Yoshimura et al. |
| 6,744,072 | B2 | 6/2004 | Romano et al. |
| 6,758,608 | B2 | 7/2004 | Van Arendonk et al. |
| 6,806,111 | B1 | 10/2004 | Ehrichs et al. |
| 6,930,330 | B2 | 8/2005 | Choi et al. |
| 7,012,239 | B2 | 3/2006 | Kim et al. |
| 7,157,741 | B2 | 1/2007 | Kim et al. |
| 7,253,491 | B2 | 8/2007 | Lee et al. |
| 2002/0131727 | A1 | 9/2002 | Reedy et al. |
| 2002/0135869 | A1 | 9/2002 | Banish et al. |
| 2002/0181915 | A1 | 12/2002 | Craig et al. |
| 2003/0020121 | A1 | 1/2003 | Rockwell et al. |
| 2003/0127655 | A1* | 7/2003 | Choi et al. .................... 257/79 |
| 2003/0136969 | A1 | 7/2003 | Kuniyasu |
| 2003/0160179 | A1* | 8/2003 | Yeh et al. ................ 250/423 R |
| 2003/0218666 | A1 | 11/2003 | Holm et al. |
| 2004/0113051 | A1* | 6/2004 | Kim et al. ................ 250/214.1 |
| 2004/0208415 | A1* | 10/2004 | Kim et al. ..................... 385/14 |
| 2004/0227140 | A1* | 11/2004 | Lee et al. ...................... 257/79 |
| 2006/0113552 | A1* | 6/2006 | Song et al. .................... 257/88 |
| 2006/0115916 | A1 | 6/2006 | Lee et al. |
| 2006/0226445 | A1 | 10/2006 | Song et al. |
| 2006/0252171 | A1 | 11/2006 | Lee et al. |

FOREIGN PATENT DOCUMENTS

| | | |
|---|---|---|
| JP | 5-288020 | 11/1993 |
| JP | 06-045645 A | 2/1994 |
| KR | 20010061354 A | 7/2007 |
| SU | 728183 | 4/1980 |
| SU | 728183 B * | 4/1980 |

OTHER PUBLICATIONS

K. T-Y. Kung et al., "Implant-dose dependence of grain size and {110} texture enhancements in polycrystalline Si films by seed selection through ion channeling," *J. Appl. Phys.*, Apr. 1, 1986, pp. 2422-2428, vol. 59, No. 7.

European Search Report for Application No. 05257069.4-1235/1662586 dated Feb. 5, 2009.

A New Simple and Reliable Method to Form a Textured Si Surface for the Fabrication of a Tunnel Oxide Film, Chang, et al., IEEE Electron Device Letters, vol. 19, No. 5, May 1998, pp. 145-147.

The Characteristics of Tunnel Oxides Grown on Textured Silicon Surface With a Simple and Reliable Process, Chang, et al., IEEE Transactions on Electron Devices, vol. 46, No. 2, Feb. 1999, pp. 355-361.

Implant-Dose Dependence of Grain Size and (110) Texture Enhancements in Polycrystalline Si Films by Seed Selection Through Ion Channeling, Kung, et al., J. Appln Phys., vol. 59, No. 7, Apr. 1, 1986, pp. 2422-2428.

Silicon Oxidation Studies: Morphological Aspects of the Oxidation of Polycrystalline Silicon, Irene, et al., 1046 Journal of the Electrochemical Society, vol. 127, Mar. 1980, No. 3, Manchester, New Hampshire USA, pp. 705-713.

Polysilicon Surface-Modification Technique to Reduce Sticking of Microstructures, Yee, et al., Sensor and Actuators A Physical A 52 (Jan. 3, 1996) pp. 145-150.

K. T-Y Kung et al., "Implant-dose dependence of grain size and (110) texture enhancements in polycrystalline Si films by seed selection through ion channeling," J. Appl. Phys., Apr. 1, 1986, pp. 2422-2428, vol. 59, No. 7, American Institute of Physics, US.

* cited by examiner

SILICON OPTOELECTRONIC DEVICE, MANUFACTURING METHOD THEREOF, AND IMAGE INPUT AND/OR OUTPUT APPARATUS USING THE SAME

CROSS-REFERENCE TO RELATED PATENT APPLICATION

This application claims the benefit of Korean Patent Application No. 10-2004-0097007, filed on Nov. 24, 2004, in the Korean Intellectual Property Office, the disclosure of which is incorporated herein in its entirety by reference.

BACKGROUND OF THE DISCLOSURE

1. Field of the Disclosure

The present disclosure relates to a method of manufacturing a silicon optoelectronic device, a silicon optoelectronic device manufactured by the method and an image input and/or output apparatus using the silicon optoelectronic device.

2. Description of the Related Art

An advantage of using a silicon semiconductor substrate is that it provides excellent reliability and allows a highly integrated density of the logic device, an operation device, and a drive device on the substrate. Also, a silicon semiconductor material can be used to fabricate a highly integrated circuit at much lower cost than a compound semiconductor material, due to the use of inexpensive silicon. That is why many integrated circuits use silicon as their basic material.

In this regard, current research into the fabrication of silicon-based light-emitting devices aims to make them compatible with integrated circuits and to obtain inexpensive photoelectronic devices.

The present applicant has disclosed a silicon optoelectronic device in U.S. patent application Ser. No. 10/122,421, filed on Apr. 16, 2002. The silicon optoelectronic device includes an ultra-shallow doping region to form a quantum structure in a p-n junction of a silicon-based substrate. In this device, a period of surface flections i.e. microdefects enhancing wavelength selectivity, is formed by self-assembly under specific oxidation conditions and a specific diffusion process. For this reason, uniform production and reproduction of the microdefects are very difficult.

As described in the U.S. application Ser. No. 10/122,421, the wavelength of the silicon optoelectronic device having the light emitting characteristics or/and light receiving characteristics due to the quantum structure formed by an ultra-shallow diffusion process is determined by the period of the microdefects, which is a microcavity length. Thus, the microdefects must be repeatedly arranged with a specific period to select the desired wavelength band.

SUMMARY OF THE DISCLOSURE

The present invention may provide a method of manufacturing a silicon optoelectronic device for increasing wavelength selectivity by controlling a microcavity length. The present invention also may provide a silicon optoelectronic device manufactured by the method and an image input and/or output apparatus having the same.

According to an aspect of the present invention, there may be provided a method of manufacturing a silicon optoelectronic device, including: preparing an n-type or p-type silicon-based substrate; forming a polysilicon at one or more regions on the surface of the substrate; oxidizing the surface of the substrate where the polysilicon is formed to form a silicon oxidation layer on the substrate, and forming a microdefect flection pattern at the interface between the substrate and the silicon oxidation layer, wherein the microdefect flection pattern is formed by the oxidation during oxidation process accelerated by oxygen traveling through boundaries of the grains in the polysilicon; exposing the microdefect flection pattern by etching the silicon oxidation layer; and forming a doping region by doping the exposed microdefect flection pattern in an opposite type to the substrate.

The forming of the polysilicon may include: forming an amorphous silicon by implanting a predetermined amount of a preamorphization material into the region of the substrate; and transforming the amorphous silicon to a polysilicon by a high temperature process.

The preamorphization material may be a silicon ion or an inactive element.

A microdefect of the microdefect flection pattern may be formed to have about a single period for emitting and/or receiving light of a specific wavelength.

The region where the polysilicon is formed may be a two-dimensional array, and an oxidation process, an etching process and a doping process are performed to form a two-dimensional array of silicon optoelectronic devices.

The silicon optoelectronic device may be formed to include a plurality of silicon optoelectronic elements emitting and/or receiving light of a plurality of wavelengths by forming a plurality of polysilicons having different grain sizes through repetition of the polysilicon forming process on a plurality of regions of the substrate, forming a plurality of microdefect flection patterns having different periods by an oxidation process, and performing an etching process and a doping process.

A group of a plurality of polysilicons may be formed on the substrate as a two-dimensional array, and an oxidation process, an etching process and a doping process are performed to form a two-dimensional array of silicon optoelectronic devices emitting and/or receiving light of a plurality of wavelengths.

The plurality of polysilicons may be formed to have different grain sizes by implanting differing amounts of a preamorphization material.

The preamorphization material may be a silicon ion or an inactive element.

The method may further include forming an electrode pattern at the doping region, to be electrically connected to the doping region.

The doping region may be formed to have a quantum structure for generating an optoelectric conversion effect by a quantum confinement effect at a p-n junction between the doping region and the substrate.

According to another aspect of the present invention, there is provided a silicon optoelectronic device manufactured by the above mentioned method.

According to a further aspect of the present invention, there is an image input and/or output apparatus, including: a silicon optoelectronic device panel formed by arranging silicon optoelectronic devices for inputting and/or outputting an image as a two-dimensional array on an n-type or p-type silicon-based substrate, wherein the silicon optoelectronic devices are manufactured by the above method.

An electrode pattern may be formed on the substrate for inputting and/or outputting an image according to each pixel of a silicon optoelectronic panel.

The silicon optoelectronic device may include a plurality of silicon optoelectronic elements for receiving and/or emitting light of different wavelengths, and one silicon optoelectronic device is included in each pixel of the silicon optoelectronic panel.

BRIEF DESCRIPTION OF THE DRAWINGS

The above and other features and advantages of the present invention will be described in detailed exemplary embodiments thereof with reference to the attached drawings in which.

DETAILED DESCRIPTION OF EXEMPLARY EMBODIMENTS

The present invention will now be described more fully with reference to the accompanying drawings, which show exemplary embodiments of a method of manufacturing a silicon optoelectronic device, a silicon optoelectronic device manufactured by the method, and an image input and/or output apparatus according to the present invention.

FIGS. 1 through 7 show a manufacturing process of a silicon optoelectronic device according to an embodiment of the present invention.

Figure 1:
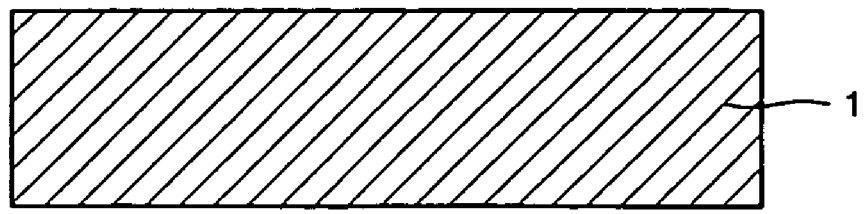
FIGS. 1 through 7 show a manufacturing process of a silicon optoelectronic device according to an embodiment of the present invention.

Referring to FIG. 1, an n-type or p-type silicon-based substrate 1 is prepared. The substrate 1 may be made of a semiconductor material containing silicon (Si), for example, Si or SiC. The substrate 1 is doped with an n-type dopant. A silicon based wafer may be used as the substrate 1. Alternatively, the substrate 1 is made of diamond.

Next, polysilicon is formed at regions of the surface of the substrate 1 according to the manufacturing processes shown in FIGS. 2A through 2E. FIGS. 2A through 2E show an embodiment of a method of forming polysilicon having different grain sizes on three regions in the substrate 1, for obtaining microdefect flection patterns having different periods for emitting and/or receiving red, green and blue light.

Figure 2A:
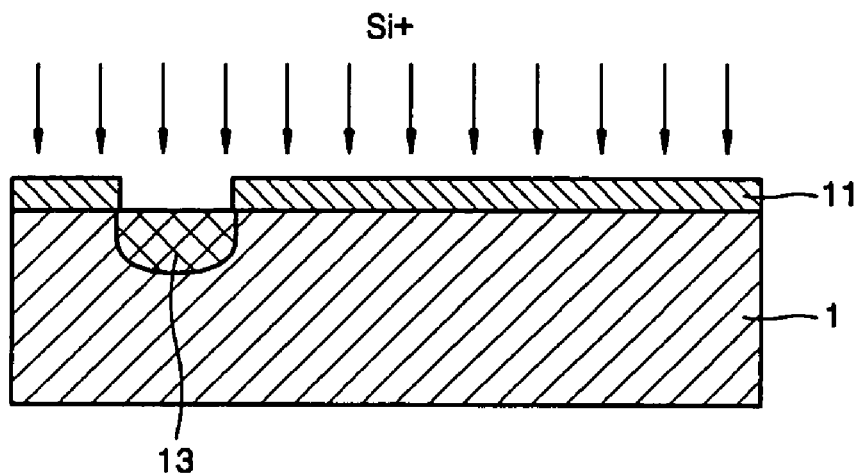
Figure 2B:
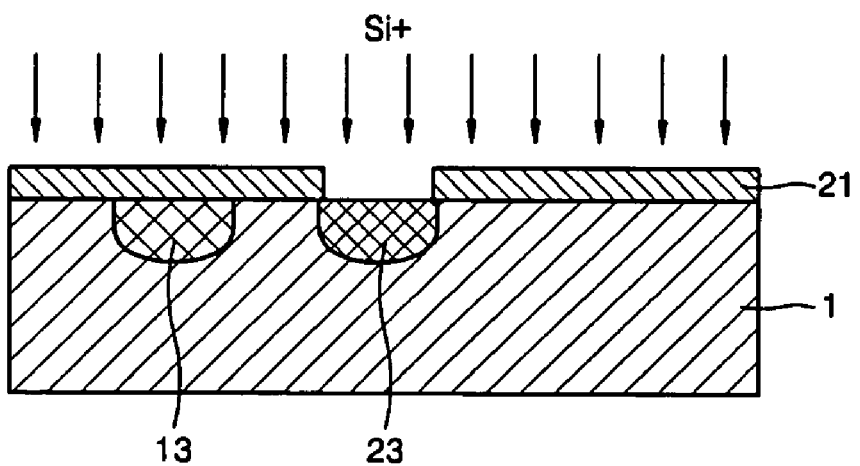
Figure 2C:
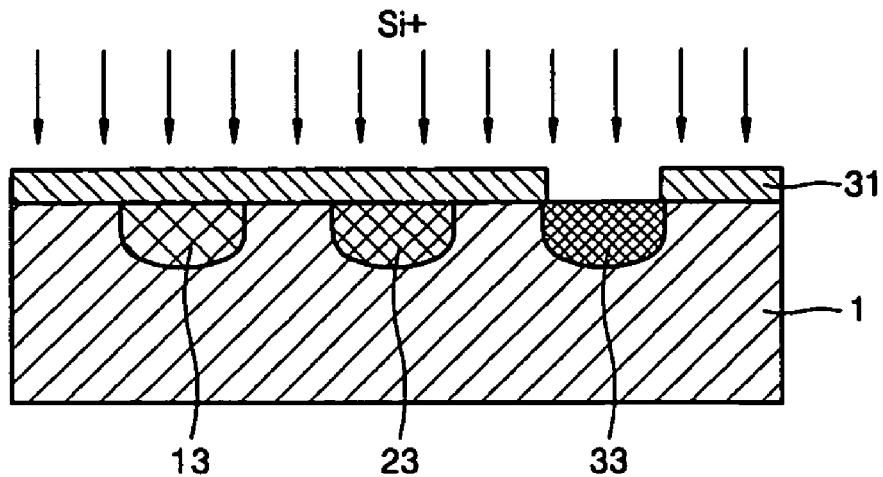
Figure 2D:
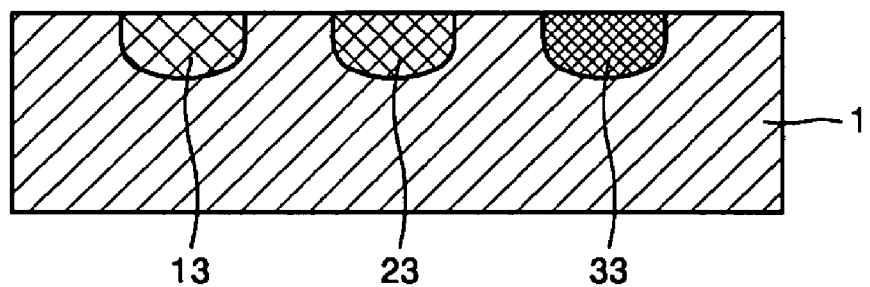
Figure 2E:
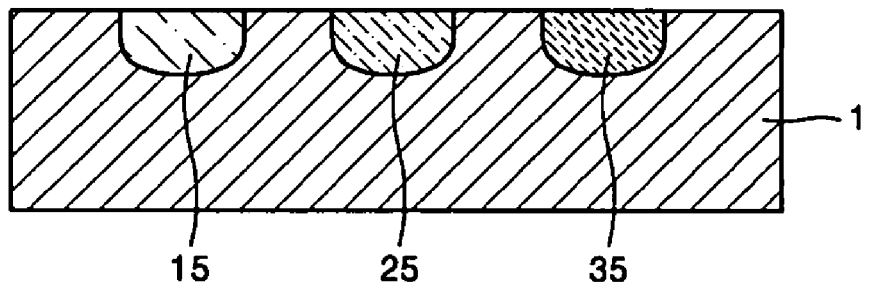

Referring to FIG. 2A, a first photoresist layer 11 is formed on the substrate 1 for forming a first polysilicon 15 shown in FIG. 2E.

The first photoresist layer 11 is formed to have openings in desiring region of the substrate to form the first polysilicon 15. The size of the opening is sub-micronic. The photoresist layers 11, 21, 31 shown in FIGS. 2A through 2C may be formed by forming the photoresist layers on the substrates and etching regions of each photoresist layer corresponding to desired regions to form a polysilicon.

After forming the photoresist layer 11 on the substrate 1, a first amorphous silicon 13 is formed by implanting a Si preamorphization material through the opening of the photoresist layer 11 into any region on the substrate 11. After forming the first amorphous silicon 13, the photoresist layer 11 is eliminated. The preamorphization material may be implanted based on an implant method.

After eliminating the first photoresist layer 11, a second photoresist layer 21 is formed on the substrate 1 where the first amorphous silicon 13 is formed, as shown in FIG. 2B. The second photoresist layer 21 also is formed to have an opening which matches to the region of the substrate 1 where a second polysilicon 25 is shown in FIG. 2E. The opening of the second photoresist layer 21 is spaced apart from the first amorphous silicon 13 formed in the region to form the first polysilicon 15.

After forming the photoresist layer 21, the preamorphization material is implanted into a region of the substrate 1 through the opening of the photoresist layer 21 so that a second amorphous silicon 23 is formed. The amount of implanted preamorphization material for the second amorphous silicon 23 is different from that for the first amorphous silicon 13, as will be described later. After forming the second amorphous silicon 23, the photoresist layer 21 is eliminated.

After eliminating the photoresist layer 21, a photoresist layer 31 is formed on the substrate 1 where the first and the second amorphous silicons 13 and 23 are formed as shown in FIG. 2C. The photoresist layer 31 is formed to have an opening matching to the region of the substrate where a third amorphous silicon 35 of FIG. 2E is to be formed. The opening of the photoresist layer 31 is spaced apart from the first and the second amorphous silicon 13 and 23 formed in the regions to form the first and the second polysilicons 15 and 25.

After forming the photoresist layer 31, the preamorphization material is implanted into a region of the substrate 1 through the opening of the photoresist layer 31 so that a third amorphous silicon 33 is formed. The amount of the implanted preamorphization material for the third amorphous silicon 33 is different from that for the first and for the second amorphous silicons 13 and 23, as will be described later. After forming the third amorphous silicon 33, the photoresist layer 31 is eliminated.

If the photoresist layer 31 is eliminated, the first, the second and the third amorphous silicon 13, 23, 33 formed substrate 1 is obtained, as shown in FIG. 2D. As described above, the first, the second and the third amorphous silicon 13, 23, 33 are spaced apart from each other. In this case, the amounts of preamorphization material implanted are different for the first, the second and the third amorphous silicon 13, 23, 33.

After forming the amorphous silicon 13, 23, 33, the substrate 1 is placed in a furnace and the temperature of the furnace increased to, for example, about 1150° C. Referring to FIG. 2E, the first, the second and the third amorphous silicon 13, 23, 33 are transformed into a first, a second and a third polysilicon 15, 25, 35 by this high temperature process.

Figure 8:
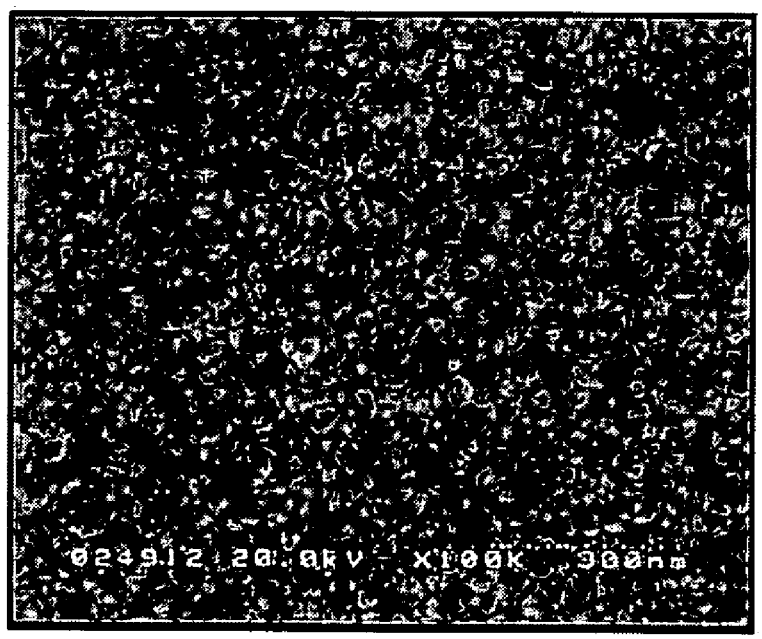
FIG. 8 shows a polysilicon surface.

As described above, the amorphous silicon is converted to polysilicon by the high temperature process. FIG. 8 shows the surface of the polysilicon. As shown in FIG. 8, there are a number of grains in the polysilicon. Oxygen can easily travel through boundaries of the grains in a following oxidation process. That is, the oxidation process is accelerated by the existence of the grains in the polysilicon.

The preamorphization material may be silicon ions including $Si^{2+}$ or $Si^{3+}$, or an inactive element.

The implanted amount of preamorphization material for forming the first, the second and the third amorphous silicons 13, 23 and 33 is determined such that the first, the second and the third polysilicons 15, 25 and 35 obtained by following a high temperature process have an appropriate size of grain, to form microdefects having a period corresponding to the wavelength of light emitting and/or to be received.

When a large amount of the preamorphization material is implanted, the grains in the polysilicon become larger. When the polysilicon includes large grains, a microdefect flection pattern of a long period can be formed.

Figure 9:
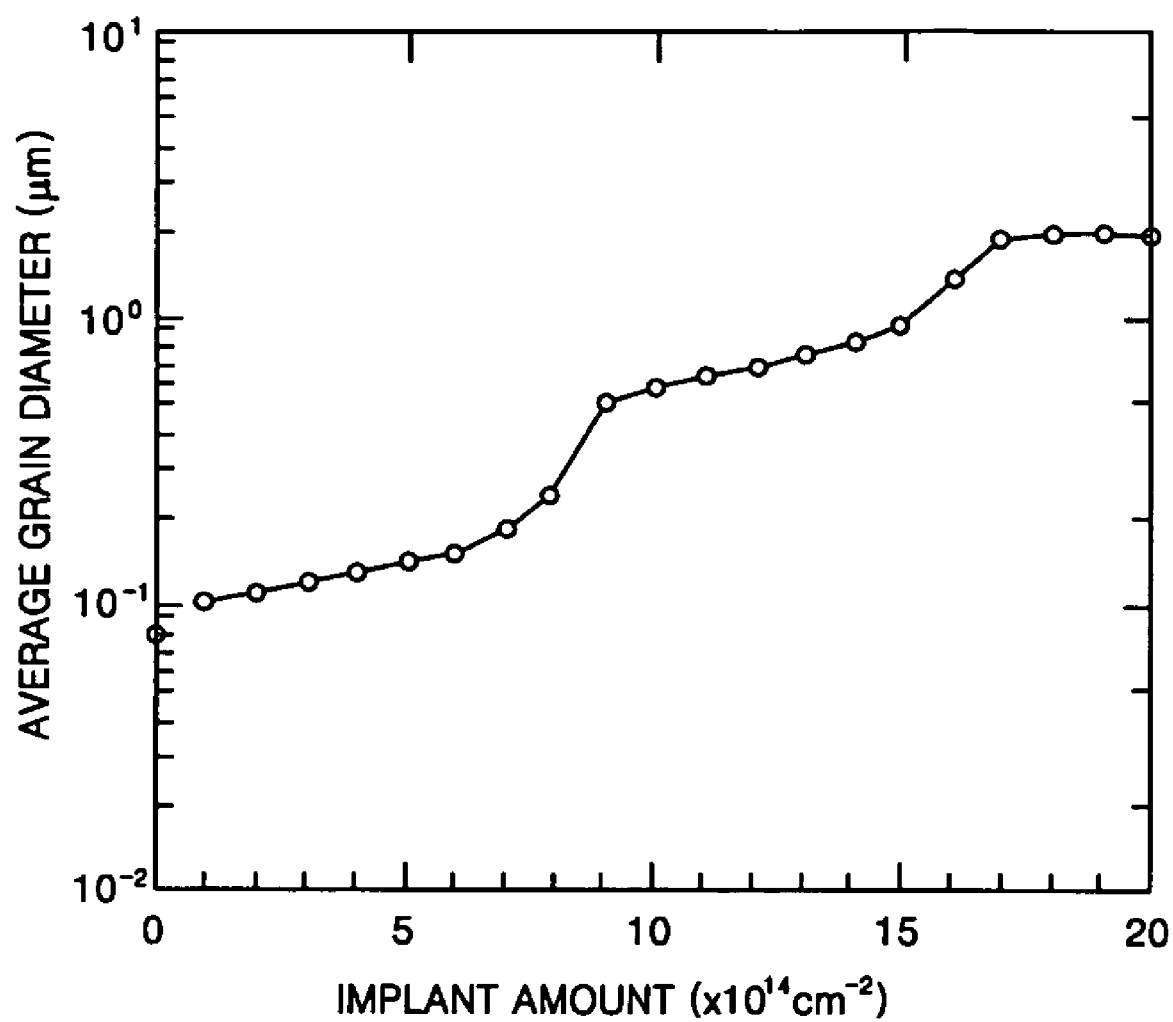
FIG. 9 is a graph showing the relationship between the amount of an implanted preamorphization material and the average diameter of polysilicon grains.

FIG. 9 is a graph showing the relationship between the implanted amount of preamorphization material and the average diameter of grains in polysilicon. The graph of the FIG. 9 was disclosed in page 2422 in Journal of Applied Physics 59(2) 1986. As shown in FIG. 9, the size of the grain in the polysilicon becomes larger in proportion to the implanted amount of preamorphization material.

Therefore, for example, when the formation of microdefect flection patterns having periods for emitting and/or receiving red light R, green light G and blue light B, respectively is desired in corresponding regions of the first, the second and the third amorphous silicon 13, 23, 33, the largest amount of preamorphization material is implanted into the first amorphous silicon 13, and smallest amount of preamorphization material is implanted into the third amorphous silicon 33. In this instance, the first polysilicon 15 formed on the first amorphous silicon 13 has the largest grain size, thereby, a microdefect flection pattern having a long period is formed for emitting and/or receiving red light, which has the longest wavelength. This will be described in more detail later. A second polysilicon 25 formed on the second amorphous silicon 23 may be formed with a grain size for forming a microdefect flection pattern having a period for emitting and/or receiving green light. A third polysilicon 35 formed on the third amorphous silicon 33 has a grain size for forming a microdefect flection pattern having a period for emitting and/or receiving blue light.

When the silicon optoelectronic device is formed as two-dimensional array, groups of the first, the second and the third amorphous silicon 13, 23, 33 are formed as a two-dimensional array structure corresponding to the two-dimensional array of the silicon optoelectronic device. The arrangement of the region of the first, the second and the third amorphous silicon 13, 23, 33 may be modified in various ways. A panel for inputting and/or outputting light corresponding to a color image signal based on a pixel unit can be obtained by forming the region of the first, the second and the third amorphous silicon 13, 23, 33 as a two-dimensional array, transforming the amorphous silicon to the polysilicon by a high temperature process, and performing an oxidation process, an etching process, a doping process and an electrode patterning process, which will be explained later.

Figure 3:
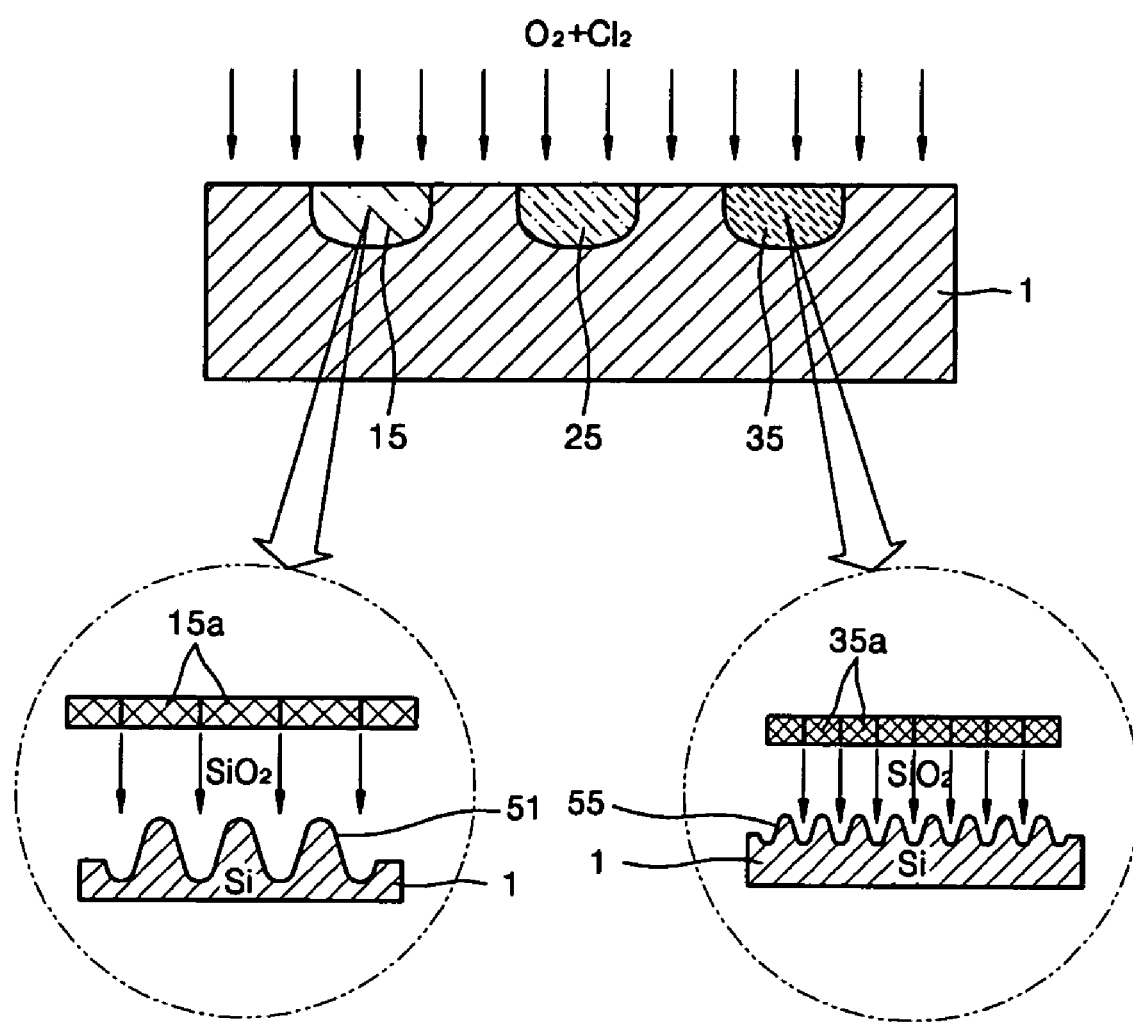

After forming the polysilicons, the oxidation process, i.e. a dry oxidation process, is performed as shown in FIG. 3, to form a silicon oxidation layer ($SiO_2$) 40 on the surface of the substrate where the first, the second and third polysilicon 15, 25 and 35 are formed.

The oxidation process may be a dry oxidation process in a gas atmosphere containing $O_2$ and $Cl_2$, at a high temperature of, for example, about 1150° C. The dry oxidation process is performed for several hours or several tens of hours. The oxidation process may also be a wet oxidation process.

Nitrogen gas is basically injected into a vacuum chamber for the oxidation process to set the inner pressure of the vacuum chamber. The inner pressure of the vacuum chamber is set by using mainly oxygen gas $O_2$ and nitrogen gas $N_2$. Chlorine gas $Cl_2$ in a small amount compared with oxygen gas $O_2$, for example, about 5%, is included in the vacuum chamber.

While forming the silicon oxidation layer 40, a microdefect flection pattern is formed at the interface between the silicon oxidation layer 40 and the substrate 1, due to acceleration of the oxidation by oxygen traveling through grain boundaries in the polysilicon. The technique related to the oxidation of polysilicon is described in "Silicon Processing for the VLSI, Era vol. 1-Process Technology, page. 298" In the literature, it assumes that stress generated by the existence of the boundaries of grains accelerates the oxidation.

The chlorine gas increases the oxidation rate during a dry oxidation process. That is, the chlorine gas accelerates the reaction or diffusion of oxidants at the interface between an oxidation layer i.e. the silicon oxidation layer 40, and a silicon layer i.e. the substrate 1. The chlorine gas traps and neutralizes nitrogen pollution in the oxidized layer. The chlorine gas also getters metallic impurities and stacking faults from the silicon layer. If more chlorine gas than the threshold concentration is included in the gas atmosphere, this causes the formation of additional phases at the interface between the oxidation layer and the silicon layer due to accumulation of gaseous oxidation products. Therefore, the interface between oxidation layer and silicon layer ($SiO_2$/Si) becomes more rough.

Since such existence of chlorine gas makes the interface between the oxidation layer and silicon layer more rough, precise microdefect flection patterns can be obtained and a high quality silicon oxidation layer 40 can be formed.

Referring to FIG. 3 again, the first, the second and the third polysilicon 15, 25, 35 have different grain sizes. Magnified parts of FIG. 3 show exemplarily that the interface between the silicon oxidation layer 40 and the substrate 1 is oxidized to the microdefect flection pattern having a period corresponding to the size of the grain by accelerating oxidation through the boundaries of the grains 15a, 25a, and 35a when the first polysilicon 15 has large grains 15a and the third polysilicon 35 has small grains. As shown exemplarily in FIG. 3, when the first polysilicon 15 has large grains 15a and the third polysilicon 35 has small grains 35a, a first microdefect flection pattern 51 having a long period is formed at the interface where the first polysilicon 15 is formed, and a third microdefect flection pattern 53 having a short period is formed at the interface where the third polysilicon 35 is formed. The second polysilicon 25, for example, may have a grain size smaller than that of the first polysilicon 15 and larger than that of the third polysilicon 35. Here, illustration with respect to a grain in the second polysilicon 25 and oxidation process through boundaries of grains in the second polysilicon 25 is omitted.

Figure 4:
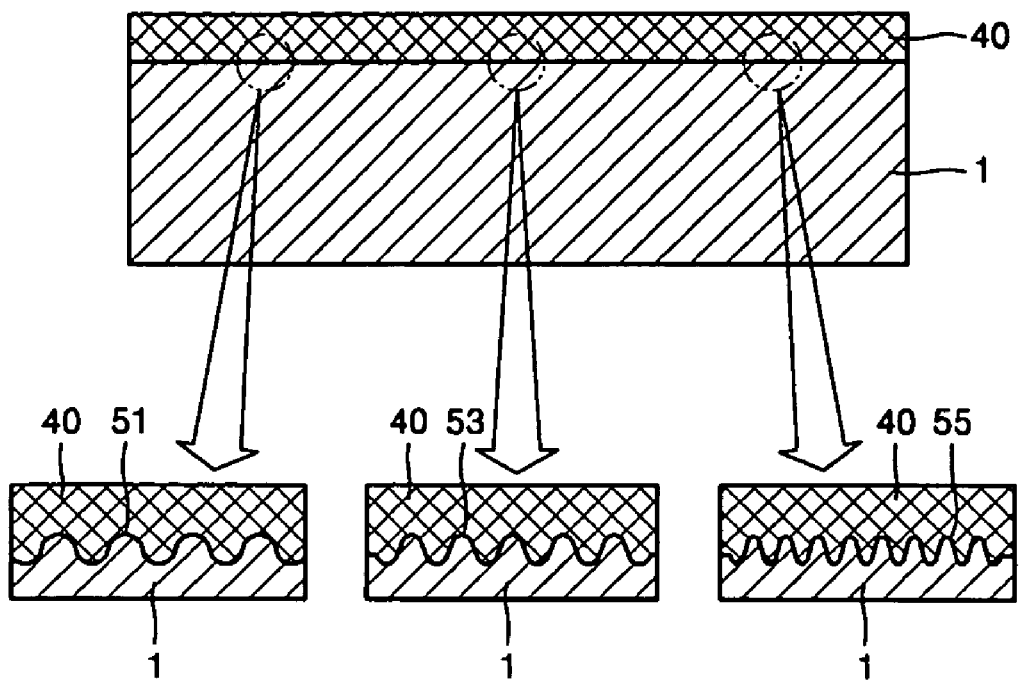

When the structure of the substrate 1 and the silicon oxidation layer 40 is formed by oxidizing the substrate 1 to constant thickness through oxidation process as mentioned above, the first, the second and the third microdefect flection patterns 51, 52, 53 are formed at the interface between the silicon oxidation layer 40 and the substrate 1 ($SiO_2$/Si interface) where the first, the second and the third polysilicon 15, 25, 35 are formed as shown in a magnified part of FIG. 4.

Since the grain sizes of the first, the second and the third polysilicon 15, 25, 35 are different, the period of the microdefects, that is the microcavity lengths in the first, the second and the third microdefect flection patterns are different.

The microdefects of the first microdefect flection pattern 51 region, for example, may be formed to have a period to emit and/or to receive light of a red R wavelength region. The microdefects of the second microdefect flection pattern 52 region may be formed to have a period to emit and/or to receive light of green G wavelength region. The microdefect of the third microdefect flection pattern 53 region may be formed to have a period to emit and/or to receive light of blue B wavelength region.

Figure 5A:
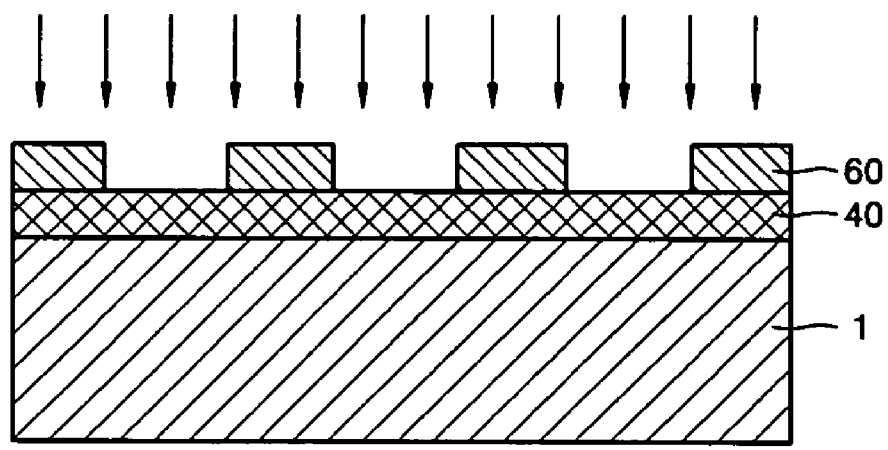
Figure 5B:
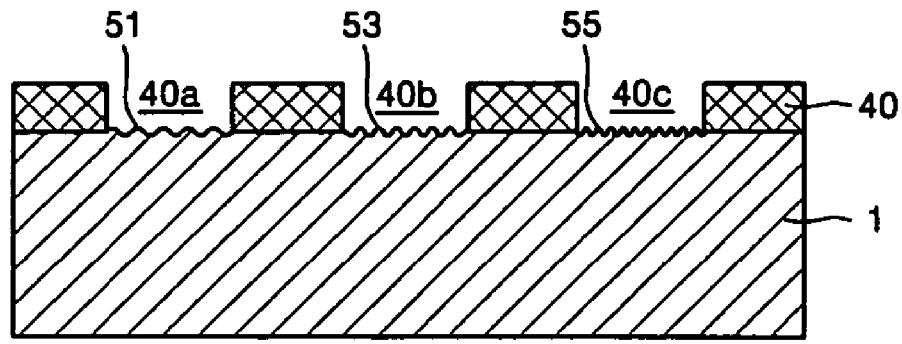

After performing the oxidation process as described above, an etching process is performed as shown in FIGS. 5A and 5B. That is, regions of the silicon oxidation layer 40 where the first, the second and the third polysilicon 15, 25, 35 are formed are etched to expose the first, the second and the third microdefect flection patterns 40a, 40b, 40c formed at the interface between the silicon oxidation layer 40 and the substrate 1. The exposed region is larger than the regions where the first, the second and the third polysilicon 15, 25, 35 are formed. The first, the second and the third microdefect flection patterns are exaggerated in FIGS. 5A and 5B.

Referring to FIG. 5A, a photoresist layer 60 is formed on the silicon oxidation layer 40 and patterned to expose regions corresponding to the first, the second and the third polysilicon 15, 25, 35 of the silicon oxidation layer 40. After patterning, the exposed silicon oxidation layer 40 region is etched, and then the photoresist layer 60 is eliminated. As a result, the pattern of the silicon oxidation layer 4 having openings 40a, 40b, 40c obtained by eliminating the regions of the silicon oxidation layer 40 where the first, the second and the third polysilicon 15, 25, 35 are formed is obtained as shown in FIG. 5B.

Figure 6:
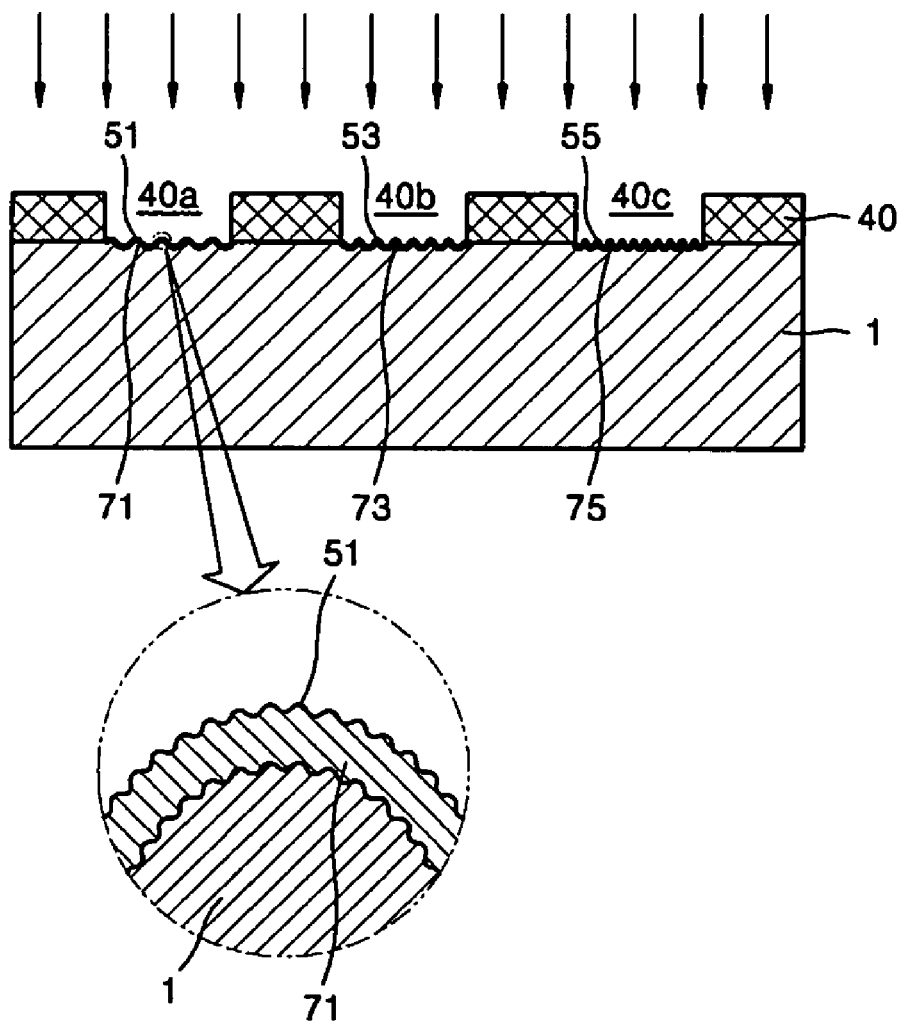

Referring to FIG. 6, after patterning of the silicon oxidation layer 40, the first, the second and the third microdefect flection patterns 51, 53, 55 are doped with a dopant of the opposite type to the substrate 1, to 10 to 20 nm depth by using the pattern of the silicon oxidation layer 4 as a mask, thereby forming first, second and third doping regions 71, 73 and 75.

When a dopant such as boron or phosphorous is injected into the substrate 1 through the openings 40a, 40b, 40c of the silicon oxidation layer 40 pattern, for example, by a non-equilibrium diffusion process, there are formed ultra-shallowly doped regions with the opposite type to the substrate 1, for example, a p+ type, along the surfaces of the first, the second and the third microdefect flection patterns 51, 53, 55.

Figure 10:
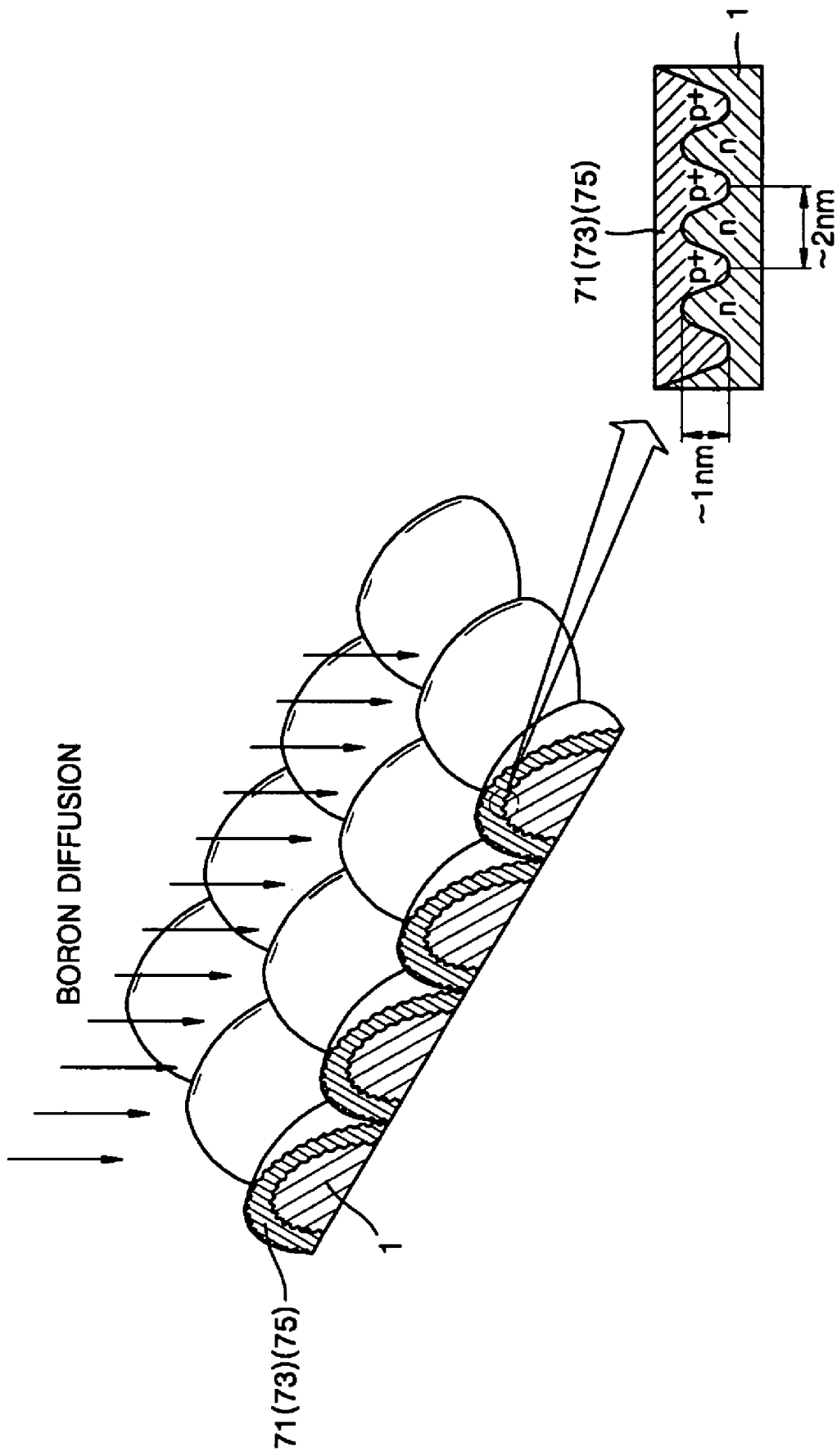
FIG. 10 shows a microdefect flection pattern and the quantum structure of a p-n junction region of an ultra-shallow doping region.

As a result, the first, the second and the third doping regions 71, 73, 75 having a quantum structure are formed at the p-n junction between doping region and the substrate 1. The magnified part of FIG. 6 shows the p-n junction between the substrate and the first doping region 71. In FIG. 6, the first, the second and the third microdefect flection patterns 15, 25, 35, and the first, the second and the third doping regions 71, 73, 75 are exaggerated. FIG. 10 shows a microdefect flection pattern and the quantum structure of a p-n junction region of a doping region ultra shallowly doped.

Although a non-equilibrium diffusion process is used here for the formation of the ultra-shallow doping regions 71, 73, 75 having the quantum structure at the p-n junction, other processes such as implantation can also be used, while the doping regions are formed to the desired shallow depth.

The substrate 1 may be doped with a p type, and the first, the second and the third doping regions 71, 73, 75 may be doped with a n+ type.

As mentioned above, when the doping process is controlled so that the doping regions are formed to an ultra-shallow depth, a quantum structure including at least one of a quantum well, a quantum dot and a quantum wire is formed at the interface between the doping regions of the substrate 1, i.e. a p-n junction. Therefore, the quantum confinement effect occurs at the p-n junction, thereby expressing the photoelectric conversion effect.

Quantum wells are mostly formed at the p-n junction regions. Quantum dots or quantum wires may be formed at the p-n junction regions. A composite structure including two or more of the quantum well, the quantum dot and the quantum wire may also be formed at the p-n junction.

At the quantum structure of the p-n junction, doping regions of opposite conductivity types alternate with each other. The sizes of wells and barriers are respectively, for example, about 2 and 1 nm thick.

Such ultra-shallow doping for forming the quantum structure at the p-n junction can be accomplished by optimally controlling the diffusion temperature and the deformed potential of a surface by the structure of the microdefect flection patterns.

The thickness of a diffusion profile can be adjusted to approximately 10-20 nm by the use of an appropriate diffusion temperature and a deformed potential due to the microdefect flection patterns formed along the surface of the substrate during diffusion. The quantum structure is created by the ultra-shallow diffusion profile thus formed.

As is well known in the field of diffusion technology, when the silicon oxidation layer 40 exceeds a proper thickness e.g. several thousand angstrom Å, or the diffusion temperature is low, vacancies mainly affect diffusion, causing a deep diffusion. On the other hand, when the silicon oxidation layer 40 is thinner than a proper thickness, or the diffusion temperature is high, silicon self-interstitials mainly affect diffusion, thereby causing a deep diffusion.

The diffusion mechanism mainly includes a kick-out mechanism by the self-interstitial and a vacancy mechanism by the vacancy. The silicon oxidation layer 40 works as a source providing the self-interstitial influencing the diffusion. When the silicon oxidation layer 40 is thin, diffusion is primarily generated by the kick-out mechanism by the self-interstitial, and when the silicon oxidation layer 40 is thick, diffusion is primarily generated by the vacancy mechanism since the supplying amount of the self-interstitial is small. In above two cases, when the effect of Si self-interstitial or vacancy is substantial, deep diffusion is generated.

However, when a silicon oxidation layer 40 is formed to an appropriate thickness and Si self-interstitial and vacancy are generated in a similar ratio, a combination of the silicon self-interstitials and the vacancies does not accelerate dopant diffusion. As a result, an ultra-shallow doping is accomplished. The physical properties of the vacancies and the self-interstitials as used herein are well known in the field of the diffusion technology, and thus, the detailed description thereof will be omitted.

When the conditions for vacancy and silicon self-interstitial are satisfied which do not influence dopant diffusion, ultra-shallow doping depth of several tens nm can be accomplished.

By the above mentioned doping process, the first, the second and the third doping regions 71, 73 and 75 are formed at the regions of the first, the second and the third microdefect flection patterns 51, 53 and 55 through the openings 40a, 40b, 40c of the silicon oxidation layer 40 pattern. In this case, since the first, the second and the third microdefect flection patterns 51, 53, and 55 have different periods, the first, the second and the third doping region 71, 73 and 75 are formed to have the periods for receiving and/or emitting light of, for example, red R, green G and blue B wavelengths.

Figure 7:
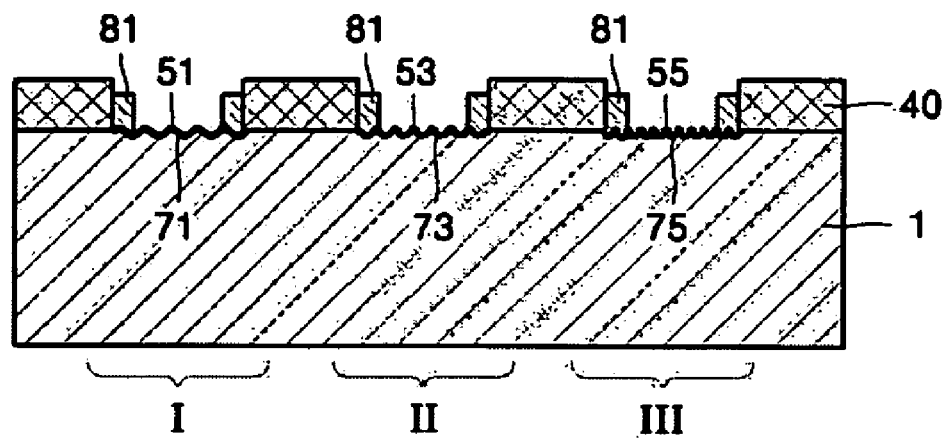

Lastly, when a first electrode pattern 81 is formed on the substrate 1 to be electrically connected to the first, the second and the third doping regions 71, 73, 75, as shown in FIG. 7, a silicon optoelectronic device shown in FIG. 7 can be obtained. As shown, the silicon optoelectronic device includes an array of three silicon optoelectronic elements for emitting and/or receiving three different wavelengths, such as a first silicon optoelectronic element I for red light, a second silicon optoelectronic element II for green light and third silicon optoelectronic element III for blue light. On bottom of the substrate 1, a second electrode (not shown), that is, common electrode, is formed.

In the method of manufacturing the silicon optoelectronic device according to the present invention, the oxidation process is performed after forming the first, the second and the third polysilicon 15, 25, 35 having different grain sizes. Therefore, the microcavity length can be easily controlled and a single oxidation process can form the microdefect flection patterns having the microcavity for the red wavelength, the green wavelength and the blue wavelength. Therefore, an RGB optoelectronic device can be formed in a single wafer. On the other hand, in a prior method for forming naturally a microdefect flection pattern by controlling conditions of the oxidation process, which was described in the U.S. patent application Ser. No. 10/122,421, it is difficult to control the microcavity length, and microdefect flection patterns for different colors must be formed on different wafers. Also, three oxidation processes must be performed for forming microdefect flection patterns for red, green and blue. Accordingly, the conventional method takes about three times as long as the present invention for performing the oxidation process. Therefore, an optoelectronic device can be readily manufactured according to the method of the present invention because the number of oxidation processes having need of long time is reduced.

Furthermore, in the instance of a microdefect flection pattern self-assembled along the surface of a substrate by controlling the conditions of an oxidation process, which was disclosed in U.S. patent application Ser. No. 10/122,421, samples of R, G, B must be prepared separately and then assembled for providing a white light. In the present invention, the optoelectronic devices for R, G and B can be embodied on single wafer as a pattern form.

The method of manufacturing three adjacent silicon optoelectronic devices or a two-dimensional array structure of the three silicon optoelectronic devices for receiving and/or emitting red, green, and blue light on the substrate 1 is explained and shown above. However, the arrangement of the silicon optoelectronic devices on the substrate 1 may be modified in various ways.

Also, at least one optoelectronic device for single color light or a two-dimensional array structure of the same may be formed on the substrate 1. For example, a silicon optoelectronic device for red, green or blue light may be formed on the substrate 1 by controlling the amount of preamorphization material implanted into the substrate 1 for forming amorphous silicon having a size of grain corresponding to the desired color light.

When forming at least one optoelectronic device for single color light or a two-dimensional array structure of the same on the substrate 1, the processes shown in FIGS. 2B and 2C can be omitted because only one type of amorphous silicon is formed.

Figure 11:
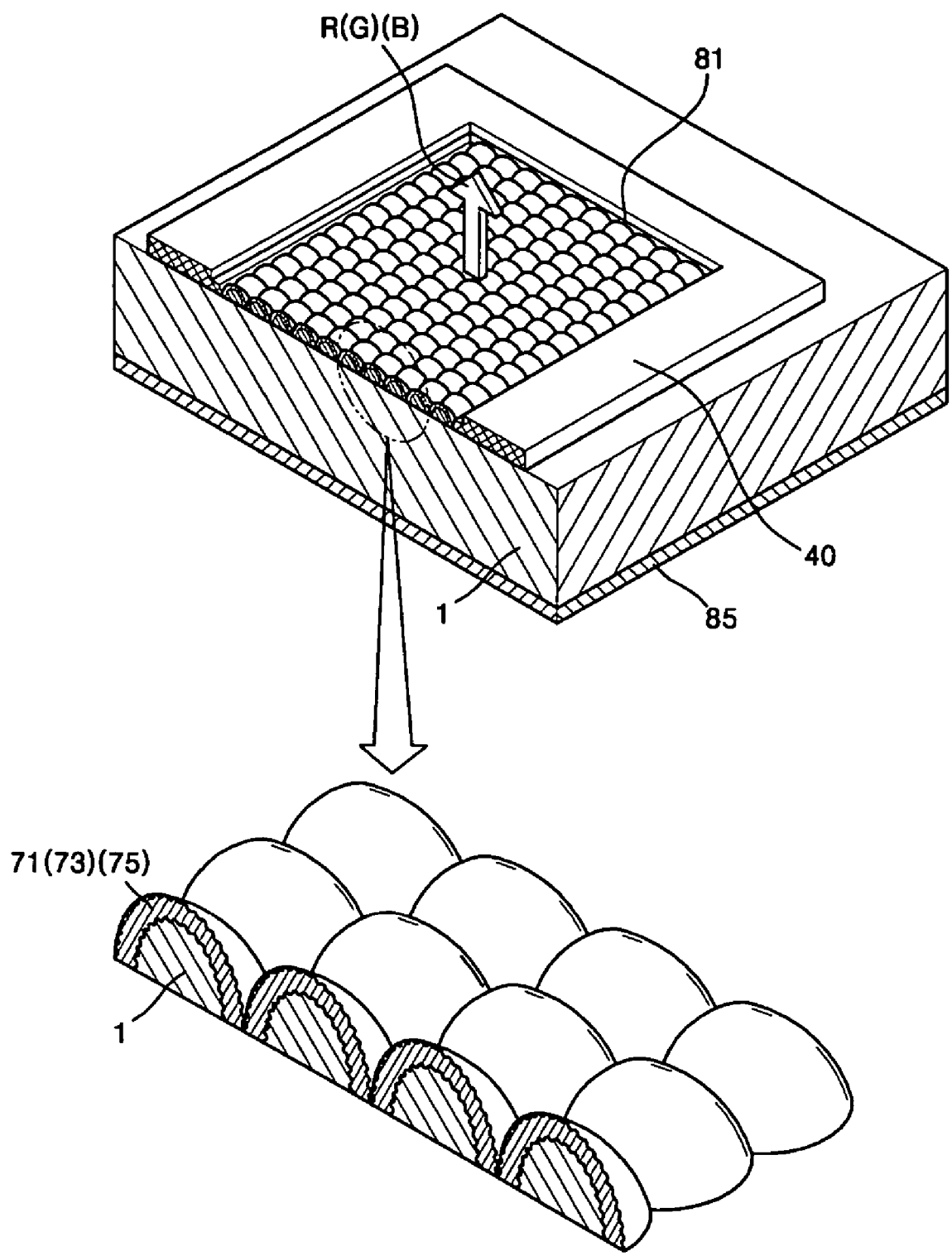
FIG. 11 is a schematic view of a silicon optoelectronic device for emitting or/and receiving a plurality of wavelengths, which is manufactured by the processes shown in FIGS. 1 through 7.

FIG. 11 is a schematic view of one silicon optoelectronic device portion of a silicon optoelectronic device for emitting and/or receiving light of a plurality of wavelengths, which is manufactured by the processes shown in FIGS. 1 through 7.

Referring to FIG. 11, a first electrode 81 is formed on the surface of the substrate 1 where the doping regions 17, 73 and 75 are formed and a second electrode 85 is formed on the bottom of the substrate 1. Reference numerals common to the above-described drawings indicate substantially the same constitutional elements. FIG. 11 shows that the first electrode 81 is made of an opaque metal and contacts the external sides of the doping regions 71, 73 and 75. The first electrode 81 may also be made of a transparent electrode material such as indium tin oxide (ITO). In this case, the first electrode 81 may be formed on the entire surface of the doping regions 71, 73 and 75.

In the silicon optoelectronic device shown in FIG. 11, the doping regions 71, 73, 75 are formed by forming the microdefect flection patterns at the interface between the silicon oxidation layer 40 and the substrate 1 by accelerating the oxidation through the grain boundaries in the polysilicon during the oxidation process, exposing the resulting microdefect flection patterns by the etching process, and ultra-shallowly doping the exposed microdefect flection patterns.

The silicon optoelectronic device of the present invention can be used as a light-emitting device and/or light receiving device since the p-n junction formed between the doping regions 71, 73, 75 and the substrate 1 has a quantum structure at which the creation and recombination of electron-hole pairs occur.

The silicon optoelectronic device may function as a light-emitting device as follows. For example, if an electric power (a voltage or a current) is applied across the first electrode 81 and the second electrode 85, carriers, i.e. electrons and holes, are injected into the quantum wells of the p-n junction and recombined (annihilated) at a subband energy level of the quantum wells. In this case, electroluminescence (EL) occurs at various wavelengths according to the recombination state of carriers, and only light of specific wavelength is amplified and emitted due to the microdefect period (microcavity length) of the microdefect flections 51, 53 and 55. The quantity of light generated varies depending on the voltage or current applied across the first and the second electrodes 81 and 85.

The silicon optoelectronic device also may function as a light-receiving device as follows. When only light of a specific wavelength band according to the microdefect period of the microdefect flection pattern artificially formed is incident on the p-n junction and photons are absorbed in the p-n junction of the quantum well structure, electrons and holes are excited at a subband energy level of the quantum well. Therefore, when an external circuit (not shown), for example, load resistance is connected to an output terminal, a current proportional to the quantity of received light is output.

The silicon optoelectronic device according to the present invention as described above has a high quantum efficiency since the quantum confinement effect occurs due to local variations in potential of charge distribution at the p-n junction of the ultra-shallow doping regions 71, 73 and 75 and a subband energy level is formed in the quantum well.

As described above, the silicon optoelectronic device for emitting and/or receiving red, green and blue light at different doping regions can be obtained by forming the first, the second and the third polysilicons 15, 25, 35, performing the oxidation process for forming the first, the second and the third microdefect flection patterns 51, 53, 55 having different microcavity lengths corresponding to red, green and blue wavelength bands at the interface between the silicon oxidation layer 40 and the substrate 1, and performing the etching process and the doping process.

For realizing color image, an optoelectronic device omitting and/or receiving lights of red, green and blue is generally required. In consideration of this requirement, in the present embodiment above described, the method of manufacturing the silicon optoelectronic device for wavelengths of red, green and blue is described and illustrated. However, this is only for exemplary purposes. That is, the present invention can be applied to manufacture a silicon optoelectronic device for more than three wavelengths by forming a plurality of polysilicons having various grain sizes, by controlling the amount of preamorphization material implanted and performing the above mentioned processes.

According to the present invention, a silicon optoelectronic device may be manufactured to have superior characteristics for selecting and amplifying a specific wavelength band, because a microdefect flection pattern having desired microcavity length can be formed on the substrate 1.

As described above, in the prior method disclosed in U.S. patent application Ser. No. 10/122,421, it was not easy to control the microcavity length because the microcavity was self-assembled during the process. The microcavities for various wavelengths were mixed, and the process conditions for selecting a specific wavelength could not be easily defined.

However, in the present invention, since the amorphous silicon is formed by controlling the amount of preamorphization material implanted, and the amorphous silicon is transformed to polysilicon by a high temperature process, the polysilicon having a grain size corresponding to a desired wavelength band is obtained. After forming the polysilicon, the microdefect flection patterns are formed to have the desired microcavity length because the oxidation is accelerated through the boundaries of the grains of the polysilicon during oxidation process. Therefore, a silicon optoelectronic device for a specific wavelength band can be readily manufactured and the uniformity and reproducibility are improved.

More specifically, it is possible to filter only the light of specific wavelength band because a microdefect flection pattern having regularly formed microdefects can be formed on the surface of the silicon optoelectronic device according to the present embodiment. It is also possible to amplify the light of specific wavelength band or attenuate the light of an unwanted wavelength band by regularly forming microdefects on the surface of the silicon optoelectronic device as mentioned above in comparison with a structure having an irregular microdefect patterns or plane.

Hereinafter, an image input and/or output apparatus will be explained as an embodiment of a device having the silicon optoelectronic device array according to the present invention.

Figure 12:
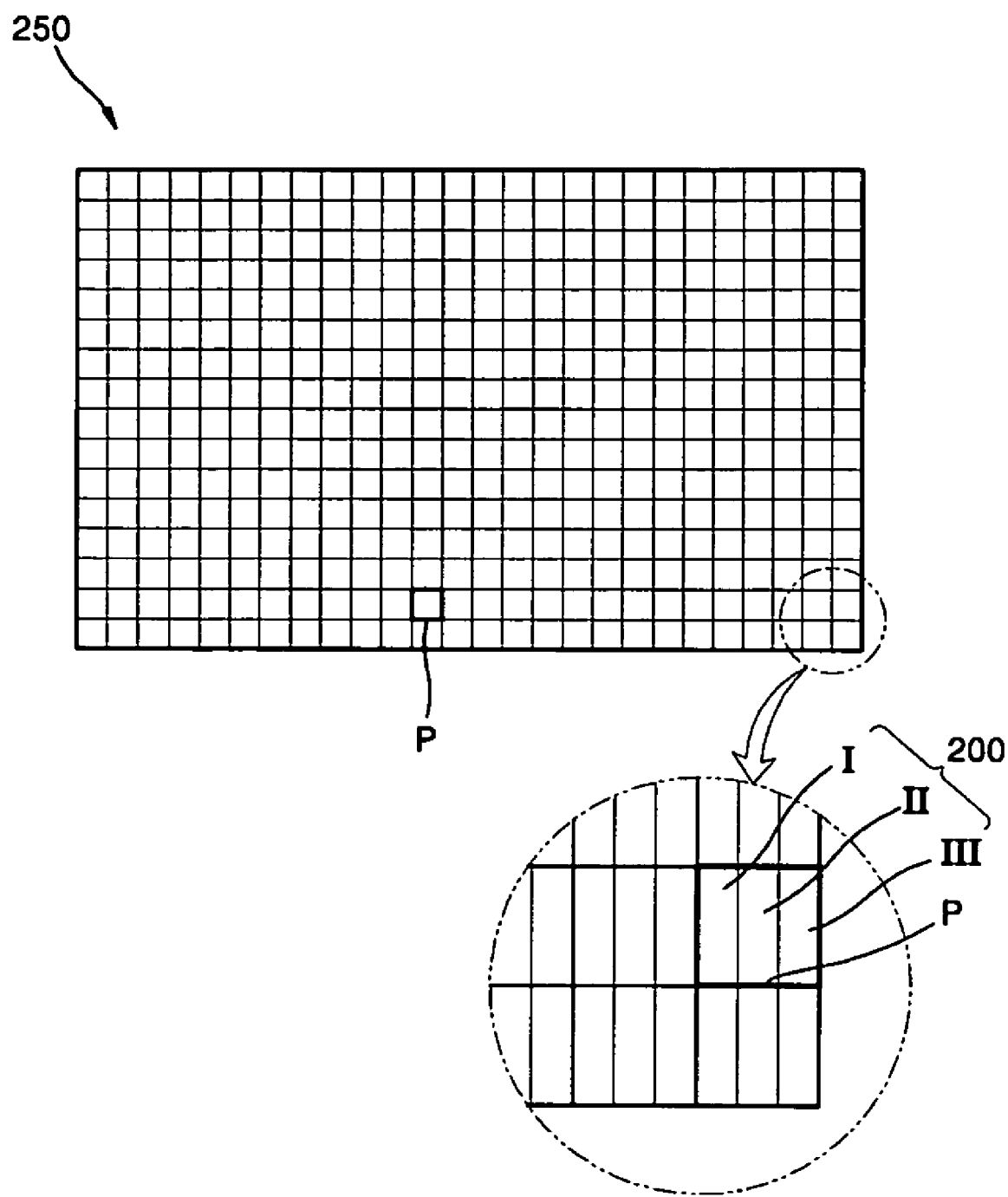
FIG. 12 is a schematic plane diagram of an image input and/or output device according to an embodiment of the present invention.

FIG. 12 is a schematic plane diagram of an image input and/or output apparatus according to an embodiment of the present invention.

Referring to FIG. 12, the image input and/or output apparatus according to the present invention includes a silicon optoelectronic device panel 250 having a two-dimensional array of silicon optoelectronic devices 200, each of which leads to input and/or output of an image, formed on an n-type or a p-type silicon-based single substrate 1. The term, "image output" as used herein means substantially an image display. The term, "image input" as used herein means substantially the generation of an electric image signal by a camera photographing an object.

The silicon optoelectronic device 200 includes first, second and third silicon optoelectronic elements I, II, III which are formed according to the manufacturing processes shown in FIGS. 1 through 7 for emitting and/or receiving red R, green G and blue B light.

Each of the silicon optoelectronic elements I, II, III of the silicon optoelectronic device 200 functions as a light emitting and/or receiving device of a specific wavelength band due to the microcavity length of the microdefect flection pattern and the creation and recombination of electron-hole pairs by the quantum confinement effect at the p-n junction of the doping region which is ultra-shallowly doped along the surface of the microdefect flection pattern.

Accordingly, it is possible to manufacture a silicon optoelectronic device panel 250 for inputting and outputting an image by forming a two dimensional array of the silicon optoelectronic devices 200 on a single substrate 1 through a series of semiconductor manufacturing process.

In this case, an electrode is patterned on the substrate 1 used as a base of the silicon optoelectronic device panel 250 so that the input and/or output of an image can be performed on a pixel-by-pixel basis in the silicon optoelectronic device panel 250 and thus an image of photographed object is converted into an electrical image signal and/or to display a two-dimensional image is displayed.

Accordingly, a two-dimensional color image can be input and/or output by using the silicon optoelectronic device panel 250 where the silicon optoelectronic device 200 is arranged in a two-dimensional array. In this case, the silicon optoelectronic device 200 having the first, the second and the third silicon optoelectronic elements I, II, and III for red, green, and blue light is included in each pixel.

As mentioned above, the electrode is patterned on the substrate 1 for inputting and/or outputting an image for each pixel P in the silicon optoelectronic device panel 250.

By using the silicon optoelectronic device panel 250, the color image can be provided without additional color filters.

It is possible to further include a color filter (not shown) on the front surface of the silicon optoelectronic device panel 250, to provide further clear color image.

The image input and/or output device of the present invention may be modified in various ways as follows, in a view of inputting and outputting an image. The various modifications of the image input and/or output device in the view of inputting and outputting an image are originated from modification of circuit configurations of controlling to input and/or output image.

Figure 13:
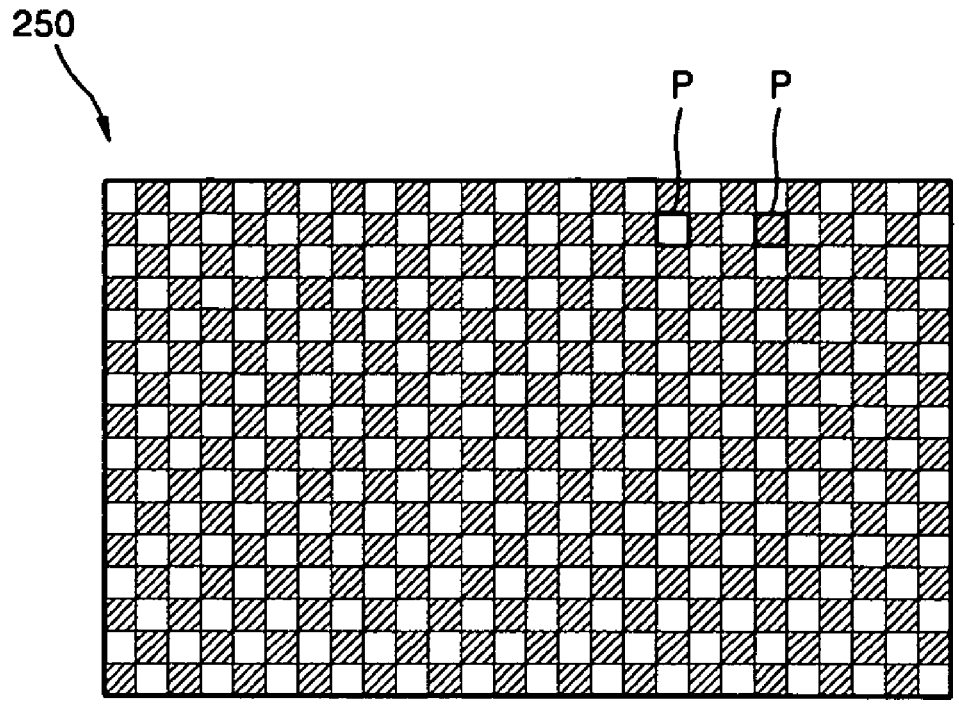
FIG. 13 is a schematic plane diagram of an image input and/or output device in a view of inputting and outputting an image according to an embodiment of the present invention.

That is, an image input and/or output apparatus according to the present invention may be formed to input and output an image using image input pixels and image output pixels that are alternately arranged as shown in FIG. 13. In FIG. 13, pixels represented by oblique lines are image input pixels where a silicon optoelectronic device 200 of the present invention is used as a light-receiving device. Pixels represented by empty squares are image output pixels where a silicon optoelectronic device 200 of the present invention is used as a light-emitting device.

As shown in FIG. 13, the image input and/or output device of the present invention may be formed in such a way that some of the silicon optoelectronic devices 200 of the silicon optoelectronic device panel 250 input an image and the others output an image.

The image input pixels and the image output pixels may have various arrangements. For example, pixels positioned at some areas of the silicon optoelectronic device panel 250 can be used as the image input pixels and the other pixels can be used as the image output pixels.

Since the silicon optoelectronic devices 200 can be used as light-emitting and receiving devices, the image input pixels and the image output pixels can be switched and the number of image input pixels and the image output pixels may also be altered when needed in an image input and/or output apparatus according to the present invention in which the input and output of an image are carried out by different silicon optoelectronic devices 200 as shown in FIG. 13. This is realized by appropriately designing the driving and/or control circuits and algorithms of an image input and/or output apparatus according to the present invention so that the image input pixels and the image output pixels are changed as necessary.

Figure 14A:
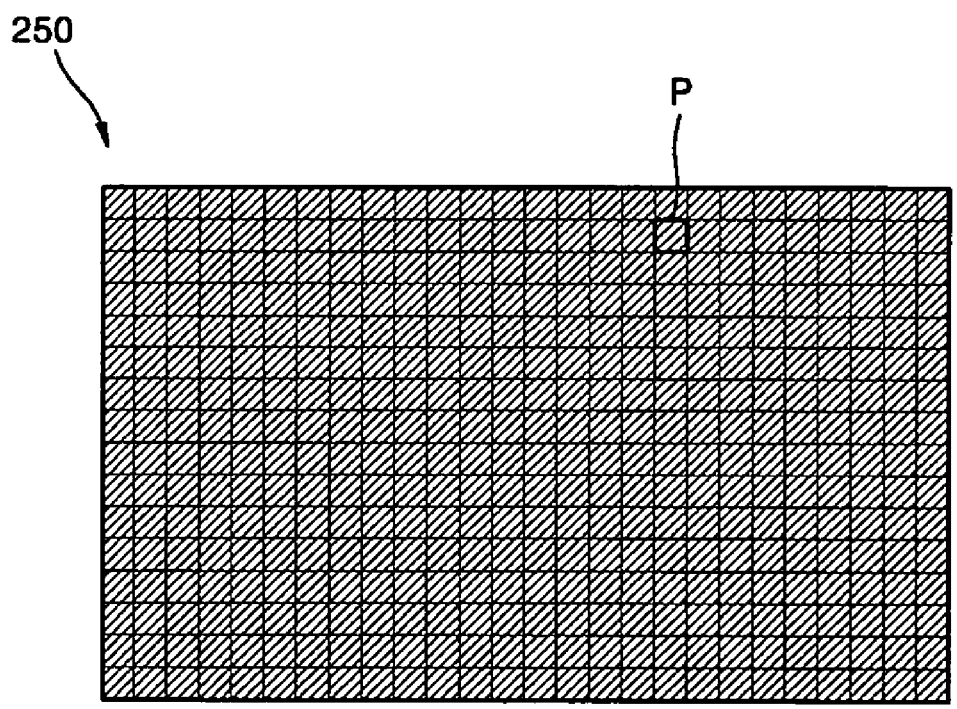
FIGS. 14A and 14B shows an image input and/or output device in a view of inputting and outputting an image according to another embodiment of the present invention.
Figure 14B:
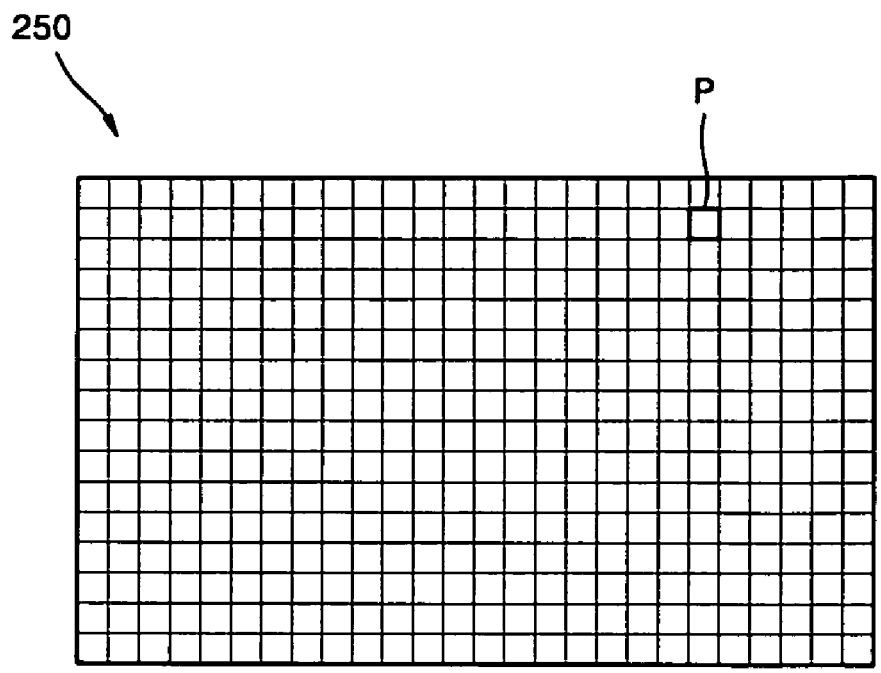

An image input and/or output apparatus according to the present invention may also be formed in such a way that the input and output of an image can be carried out by the same silicon optoelectronic device 200 of the silicon optoelectronic device panel 250 at different times, as shown in FIGS. 14A and 14B. FIG. 14A shows an image input state of the silicon optoelectronic device panel 250 of an image input and/or output apparatus according to the present invention and FIG. 14B shows an image output state of the silicon optoelectronic device panel 250 of an image input and/or output apparatus according to the present invention.

While an image input and/or output apparatus according to the present invention has been particularly shown and described with reference to exemplary embodiments thereof, various changes may be made therein without departing from the scope of the present invention.

Since an image input and/or output apparatus according to the present invention as described above can directly input optical information through a screen, it can be used in equipment for interactive visual communications and/or bidirectional information transmission, such as computer monitors, televisions, and in particular, digital televisions and handheld terminals.

In this case, since an image input and/or output apparatus according to the present invention allows the input and output of an image in a single panel, no separate camera is needed for visual communications.

Handheld terminals may be various types of portable communication equipment such as mobile phones and personal digital assistants (PDAs).

Furthermore, since an image input and/or output apparatus according to the present invention can input and output an image in a single panel, the full face of an operator can be photographed and transmitted. Therefore, vividness in visual communication is enhanced.

Up until now, the present invention has been described with a view to an image input and/or output apparatus including a single silicon optoelectronic device panel having a two-dimensional array of silicon optoelectronic devices, but is not limited thereto. That is, an image input and/or output apparatus according to the present invention may include combinations of a plurality of silicon optoelectronic device panels to provide a larger screen.

Figure 15:
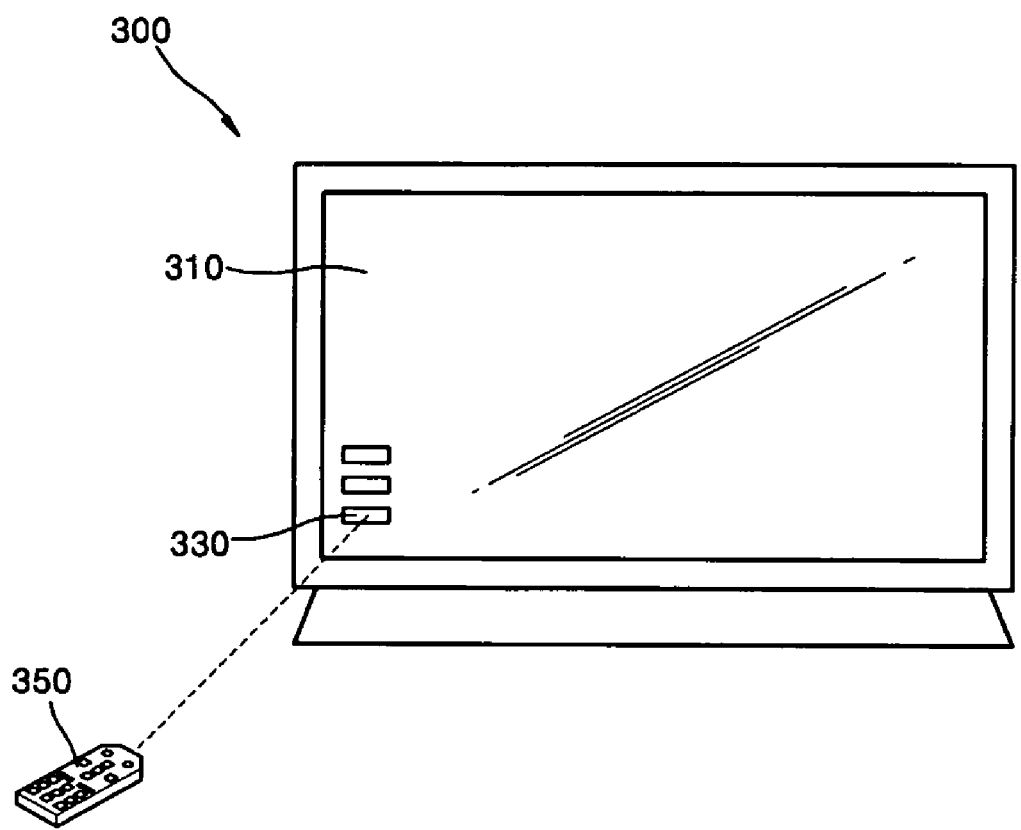
FIG. 15 shows a digital television using an image input and/or output apparatus according to the present invention.

FIG. 15 shows a digital television using an image input and/or output apparatus according to the present invention.

Referring to FIG. 15, an image input and/or output apparatus according to the present invention can be used in a digital television 300 which allows for the input of information into a screen 310 and selection of a menu using an optical wireless remote controller 350. The optical wireless remote controller 350 irradiates a beam of light in specific area like a light pointer. When a light signal is irradiated onto a specific region of the screen 310, for example, a menu 330, a silicon optoelectronic device in that region receives the light signal. According to the received light signal, changing channels of the digital television or working on the Internet is possible.

In addition, an image input and/or output apparatus of the present invention can be applied to various equipment requiring bi-directional optical information transmission.

As is apparent from the above description, the microcavity length can be easily controlled according to the present invention because the oxidation process is performed after forming a plurality of polysilicons having different grain sizes to form microdefect flection patterns having different microcavity lengths corresponding to the desired wavelengths. Therefore, according to the present invention, a silicon optoelectronic device having high wavelength selectivity is realized.

In addition, according to the present invention, a silicon optoelectronic device emitting and/or receiving light of different wavelengths in adjacent regions may be realized by performing an oxidation process, an etching process and a doping process after forming polysilicons having different grain sizes by controlling the amount of preamorphization material implanted at a plurality of regions.

Accordingly, since a microcavity length can be easily controlled and microdefect patterns suitable for red, green and blue light can be formed by a single oxidation process, a silicon optoelectronic device for emitting and/or receiving red, green and blue light can be implemented on single wafer.

Furthermore, since a silicon optoelectronic device according to the present invention can be used as both a light-emitting device and a light-receiving device, an image input and/or output apparatus that can display an image and/or input an image or optical information in a single panel can be produced.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of manufacturing a silicon optoelectronic device, comprising:
   preparing an n-type or p-type silicon-based substrate;
   forming a polysilicon at one or more regions on the surface of the substrate;
   oxidizing the surface of the substrate where the polysilicon is formed to form a silicon oxidation layer on the substrate, and forming a microdefect flection pattern at the interface between the substrate and the silicon oxidation layer, wherein the microdefect flection pattern is formed by the oxidation during oxidation process accelerated by oxygen traveling through boundaries of the grains in the polysilicon;
   exposing the microdefect flection pattern through the silicon oxidation layer; and
   forming a doped region by doping the exposed microdefect flection pattern in an opposite type to the substrate.

2. The method of claim 1, wherein forming the polysilicon includes:
   forming an amorphous silicon by implanting a predetermined amount of a preamorphization material into the region of the substrate; and
   transforming the amorphous silicon to a polysilicon by a high temperature process.

3. The method of claim 2, wherein the preamorphization material is a silicon ion or an inactive element.

4. The method of claim 2, wherein a microdefect of the microdefect flection pattern is formed to have about a single period for emitting and/or receiving light of a specific wavelength.

5. The method of claim 4, wherein the region where the polysilicon is formed is a two-dimensional array, and an oxidation process, an etching process and a doping process are performed to form a two-dimensional array of silicon optoelectronic devices.

6. The method of claim 2, wherein the silicon optoelectronic device is formed to include a plurality of silicon optoelectronic elements emitting and/or receiving light of a plurality of wavelengths by forming a plurality of polysilicons having different grain sizes through a plurality of repetition of the polysilicon forming process on a plurality of regions of the substrate, forming a plurality of microdefect flection patterns having different periods by an oxidation process, and performing an etching process and a doping process.

7. The method of claim 6, wherein a group of a plurality of polysilicons is formed on the substrate as a two-dimensional array, and an oxidation process, an etching process and a doping process are performed to form a two-dimensional array of silicon optoelectronic devices emitting and/or receiving light of a plurality of wavelengths.

8. The method of claim 6, wherein the plurality of polysilicons is formed to have different grain sizes by implanting differently the amount of a preamorphization material.

9. The method of claim 8, wherein the preamorphization material is a silicon ion or an inactive element.

10. The method of claim 6, wherein the preamorphization material is a silicon ion or an inactive element.

11. The method of claim 6, wherein the oxidation process is performed in a gas atmosphere containing oxygen and chlorine gas.

12. The method of claim 1, wherein the oxidation process is performed in a gas atmosphere containing oxygen and chlorine gas.

13. The method of claim 1, further comprising forming an electrode pattern at the doping region, to be electrically connected to the doping region.

14. The method of claim 1, wherein the doping region is formed to have a quantum structure for generating an optoelectric conversion effect by a quantum confinement effect at a p-n junction between the doping region and the substrate.

15. The method of claim 14, wherein the doping region is formed by a non-equilibrium of dopant.

16. A silicon optoelectronic device manufactured by the method of claim 1.

17. The silicon optoelectronic device of claim 16, wherein a polysilicon silicon is formed by forming an amorphous silicon by implanting a preamorphization material into the region of substrate and performing a high temperature process with the amorphous silicon.

18. The silicon optoelectronic device of claim 17, wherein the preamorphization material is a silicon ion or an inactive element.

19. The silicon optoelectronic device of claim 17, wherein a microdefect of the microdefect flection pattern is formed to have about single period for emitting and/or receiving a light of a specific wavelength.

20. The silicon optoelectronic device of claim 19, wherein a two-dimensional array of the silicon optoelectronic device is formed by forming a region where the polysilicon is formed as a two-dimensional array, and performing an oxidation process, an etching process and a doping process.

21. The silicon optoelectronic device of claim 17, wherein the silicon optoelectronic device is formed to include a plurality of silicon optoelectronic elements emitting and/or receiving light of a plurality of wavelengths by forming a plurality of the polysilicons on a plurality of regions of the substrate to have different grain sizes, forming a plurality of the microdefect flection patterns to have different periods by an oxidation process, and performing an etching process and a doping process.

22. The silicon optoelectronic device of claim 21, wherein a group of a plurality of polysilicons is arranged on the substrate as a two-dimensional array, and an oxidation process, an etching process and a doping process are performed to form a two-dimensional array of silicon optoelectronic devices.

23. The silicon optoelectronic device of claim 21, wherein the plurality of polysilicons are formed to have different grain sizes by implanting differently the amount of a preamorphization material.

24. The silicon optoelectronic device of claim 23, wherein the preamorphization material is a silicon ion or an inactive element.

25. The silicon optoelectronic device of claim 21, wherein the preamorphization material is a silicon ion or an inactive element.

26. The silicon optoelectronic device of claim 21, wherein the oxidation process is performed in a gas atmosphere containing oxygen and chlorine gas.

27. The silicon optoelectronic device of claim 16, wherein the oxidation process is performed in a gas atmosphere containing oxygen and chlorine gas.

28. The silicon optoelectronic device of claim 16, wherein the doping region is formed to have a quantum structure generating an optoelectric conversion effect by a quantum confinement effect at a p-n junction between the doping region and the substrate.

29. The silicon optoelectronic device of claim 28, wherein the doping region is formed by a non-equilibrium of dopant.

30. The silicon optoelectronic device of claim 16, further comprising an electrode pattern in the doping region to be electrically connected to the doping region.

31. An image input and/or output apparatus, comprising: a silicon optoelectronic device panel formed by arranging silicon optoelectronic devices for inputting and/or outputting an image as a two-dimensional array on an n-type or p-type silicon-based substrate, wherein the silicon optoelectronic devices are the silicon optoelectronic devices of claim 16.

32. The image input and/or output apparatus of claim 31, wherein the polysilicon of the silicon optoelectronic device is formed by forming an amorphous silicon by implanting a preamorphization material into a region of the substrate and performing a high temperature process with the amorphous silicon.

33. The image input and/or output apparatus of claim 32, wherein the preamorphization material is a silicon ion or an inactive element.

34. The image input and/or output apparatus of claim 32, wherein a microdefect of the microdefect flection pattern is formed to have about a single period for emitting and/or receiving light of a specific wavelength.

35. The image and/or output apparatus of claim 34, wherein a two-dimensional array of silicon optoelectronic devices is formed by forming a region where the polysilicon is formed as a two-dimensional array and performing a series of processes including an oxidation process, an etching process and a doping process.

36. The image and/or output apparatus of claim 32, wherein the silicon optoelectronic device is formed to include a plurality of silicon optoelectronic elements emitting and/or receiving light of a plurality of wavelengths by forming a plurality of the polysilicons on a plurality of regions of the substrate to have different grain sizes, forming a plurality of the microdefect flection patterns to have different periods by an oxidation process, and performing an etching process and a doping process.

37. The image input and/or output apparatus of claim 36, wherein a group of a plurality of polysilicons is arranged on the substrate as a two-dimensional array, and an oxidation process, an etching process and a doping process are performed to form a two-dimensional array of silicon optoelectronic devices.

38. The image input and/or output apparatus of claim 36, wherein the plurality of polysilicons is formed to have different grain sizes by implanting differently the amount of preamorphization material.

39. The image input and/or output apparatus of claim 38, wherein the preamorphization material is a silicon ion or an inactive element.

40. The image input and/or output apparatus of claim 36, wherein the preamorphization material is a silicon ion or an inactive element.

41. The image input and/or output apparatus of claim 36, wherein the oxidation process is performed in a gas atmosphere containing oxygen and chlorine gas.

42. The image input and/or output apparatus of claim 31, wherein the oxidation process is performed in a gas atmosphere containing oxygen and chlorine gas.

43. The image input and/or output apparatus of claim 31, wherein the doping region has a quantum structure generating an optoelectric conversion effect by a quantum confinement effect at a p-n junction between the doping region and the substrate.

44. The image input and/or output apparatus of claim 43, wherein the doping region is formed by a non-equilibrium of dopant.

45. The image input and/or output apparatus of claim 31, wherein an electrode pattern is formed on the substrate for inputting and/or outputting an image according to each pixel from a silicon optoelectronic device panel.

46. The image input and/or output apparatus of claim 31, wherein the silicon optoelectronic device includes a plurality of silicon optoelectronic elements for receiving and/or emitting light of different wavelengths, and one silicon optoelectronic device is included in each pixel of the silicon optoelectronic panel.

* * * * *